US 11,585,699 B2

(12) United States Patent
Mårtensson

(10) Patent No.: US 11,585,699 B2
(45) Date of Patent: Feb. 21, 2023

(54) TRANSMITTER AND FIELD DEVICE

(71) Applicant: KROHNE Messtechnik GmbH, Duisburg (DE)

(72) Inventor: Hans-Owe Mårtensson, Beddingestrand (SE)

(73) Assignee: KROHNE MESSTECHNIK GMBH, Duisburg (DE)

( * ) Notice: Subject to any disclaimer, the term of this patent is extended or adjusted under 35 U.S.C. 154(b) by 518 days.

(21) Appl. No.: 16/690,286

(22) Filed: Nov. 21, 2019

(65) Prior Publication Data
US 2020/0166411 A1 May 28, 2020

(30) Foreign Application Priority Data
Nov. 22, 2018 (DE) ...................... 10 2018 129 437.9

(51) Int. Cl.
*H05K 5/02* (2006.01)
*G01K 1/024* (2021.01)
*H04B 1/03* (2006.01)
*H05K 5/00* (2006.01)

(52) U.S. Cl.
CPC ............... *G01K 1/024* (2013.01); *H04B 1/03* (2013.01); *H05K 5/0017* (2013.01); *H05K 5/0247* (2013.01)

(58) Field of Classification Search
CPC .......... G01K 1/024; G01K 1/028; H04B 1/03; H05K 5/0017; H05K 5/0247; G01D 21/00; G08C 17/02

USPC .......................................................... 455/24
See application file for complete search history.

(56) References Cited

U.S. PATENT DOCUMENTS

| 9,996,063 | B2 | 6/2018 | Miyazaki et al. |
| 2005/0245291 | A1 | 11/2005 | Brown et al. |
| 2010/0013462 | A1* | 1/2010 | Fink ........................ H01H 25/06 324/207.2 |
| 2014/0297046 | A1* | 10/2014 | Miyazaki ............... G05B 15/02 700/282 |

FOREIGN PATENT DOCUMENTS

| DE | 102014106540 A1 | 11/2015 |
| DE | 102016207826 A1 | 11/2017 |

* cited by examiner

*Primary Examiner* — Shaima Q Aminzay
(74) *Attorney, Agent, or Firm* — David S. Safran; Calderon Safran & Cole P.C.

(57) ABSTRACT

A transmitter having a transmitter housing (3), an electronics unit (4) and a display unit (5), the electronics unit (4) having a connection for a measured value sensor (6), the electronics unit (4) being connected to the display unit (5), and the transmitter housing (3) having at least one cable gland (7). To allow for a particularly simple and secure external operation, at least one connection module (9) is arranged in the at least one cable gland (7), and the at least one connection module (9) has at least one operating element (10) for communication with the display unit (5) and/or the electronics unit (4).

10 Claims, 2 Drawing Sheets

TRANSMITTER AND FIELD DEVICE

BACKGROUND OF THE INVENTION

Field of the Invention

The invention comprises a transmitter with a transmitter housing, an electronics unit and a display unit, wherein the electronics unit is designed for connection to a measured value sensor, wherein the electronics unit is connected to the display unit and wherein the transmitter housing has at least one cable gland.

In addition, the invention concerns a field device with a measured value sensor and a transmitter, wherein the transmitter has a transmitter housing, an electronics unit and a display unit, wherein the electronics unit is connected to the measured value sensor, wherein the electronics unit is connected to the display unit and wherein the transmitter housing has at least one cable gland.

Description of Related Art

When field devices are used, transmitters, which are also referred to as measuring transducers, are used to evaluate and/or transmit the primary measurement signals detected by the measured value sensor. For evaluation and/or transmission of the measurement signals, a transmitter has an electronics unit which is connected to the measured value sensor. Depending on the type of field device or the implemented measuring principle for recording the primary measurement signal, the measured value sensor can also be controlled via the electronics unit.

To connect the electronics unit to a control room, for example, the transmitter housing usually has passages in the form of at least one cable gland to ensure a sealed cable entry into the transmitter housing.

One type of processing and transmission of the primary measurement signals consists in the output of the measured variable of interest via a display unit. According to one design, the display unit can also be used to display secondary measured variables and/or relevant process parameters in addition to the measured variable of interest or to make various settings, for example with regard to the measuring range or a limit value. For example, the display unit can have a menu that can be navigated via an operating element. This requires an interface that gives the user access to the display unit.

Especially for transmitters that are used in potentially explosive applications, each interface in the transmitter housing is a potential weak point, so that particularly high demands are placed on the tight sealing of such a passage.

A transmitter is known from European Patent Application EP 2 784 651 A2 and corresponding U.S. Pat. No. 9,996,063 B2, wherein an operating element of the display unit is designed as a button and another control element as a rotary knob.

SUMMARY OF THE INVENTION

Based on the aforementioned prior art, the object of the invention is to provide a transmitter that allows particularly simple and secure external operation. In addition, the object of the invention is also to provide a field device having a corresponding transmitter.

According to a first aspect of the invention, the aforementioned object is achieved by a transmitter described in the introduction in that at least one connection module is arranged in the at least one cable gland and that the at least one connection module comprises at least one operating element for communication with the display unit and/or the electronics unit.

In accordance with the invention, it has been recognized that a connection module comprising an operating element, wherein the connection module is designed in such a way that it can be arranged in a cable gland, can be inserted in a particularly simple manner into the transmitter housing and, in this respect, a particularly simple and secure operation of the display unit and/or the electronics unit can be ensured.

According to a first design, the cable gland is designed as a threaded armor cable gland. This design has the advantage that a particularly tightly sealed insertion of the connection module can be guaranteed.

Furthermore, at least one cable gland can alternatively or additionally have a metric threading and/or a self-sealing NPT threading.

According to a next design, the connection module has a threading, wherein the connection module is screwed into the cable gland in such a way that the connection module acts as a plug to tightly seal the cable gland. The threading can, for example, be injection molded onto the connection module.

Preferably, the unit comprised of the cable gland and the connection module is designed in such a way that the requirements of the protection class with regard to protection against contact, penetration of foreign bodies and water as well as shock resistance according to DIN EN 60529, IP 6X and/or IP X7 and/or IP X8 and/or IP X9, in particular IP 67 and/or IP 68 and/or IP 69 are fulfilled. In accordance with a particularly preferred design, this tight sealing is guaranteed only by the threaded fitting. According to a further design, at least one further sealing element is present, preferably in the form of a sealing ring and/or a coating of the threading of the connection module.

According to the next design, at least one operating element comprises an analog operating element and/or a digital operating element.

It is particularly preferred that at least one operating element is designed in the form of a key and/or a push-button and/or a rocker switch and/or a toggle switch and/or a rotary switch and/or a slide control and/or a finger pressure sensor and/or an optical sensor and/or a microphone and/or a control lever.

According to another preferred design, the operating element is designed as a rotary encoder or encoder. A selection from the menu shown on the display unit and/or a change in the display can be implemented particularly preferably by rotating the rotary encoder, wherein the setting or selection is confirmed by pressing the rotary encoder.

It is also advantageous when the connection module comprises at least one wireless interface and/or an antenna and/or an optical interface. According to this configuration, the operating element can also be operated from a distance, so that the transmitter is accessible for communication even if it is located in hard-to-reach or inaccessible places.

According to a next design, the operating element is connected to the display unit and/or the electronics unit by means of a cable connection.

According to a next advantageous design, the connection module is interchangeably arranged in the cable gland. For this, the connection module is detachably inserted into the cable gland.

It is also advantageous when the display unit is arranged in the connection module. According to this design, a unit consisting of display unit and operating element is preferably inserted into the cable gland in an exchangeable manner. For example, the operating element can be designed as a cover or as part of a housing of the display unit.

According to a second aspect of the present invention, the object mentioned above is achieved by a field device described in the introduction, in that at least one connection module is arranged in the at least one cable gland and that the at least one connection module comprises at least one operating element for communication with the display unit and/or the electronics unit.

The transmitter is particularly preferably designed according to any one of the designs described above.

In detail, there is now a plurality of possibilities for designing and further developing the transmitter and the field device according to the invention. For this, reference is made both to the patent claims subordinate to the independent patent claims and to the following description of preferred embodiments with reference to the accompanying drawings.

DETAILED DESCRIPTION OF THE INVENTION

Figure 1:
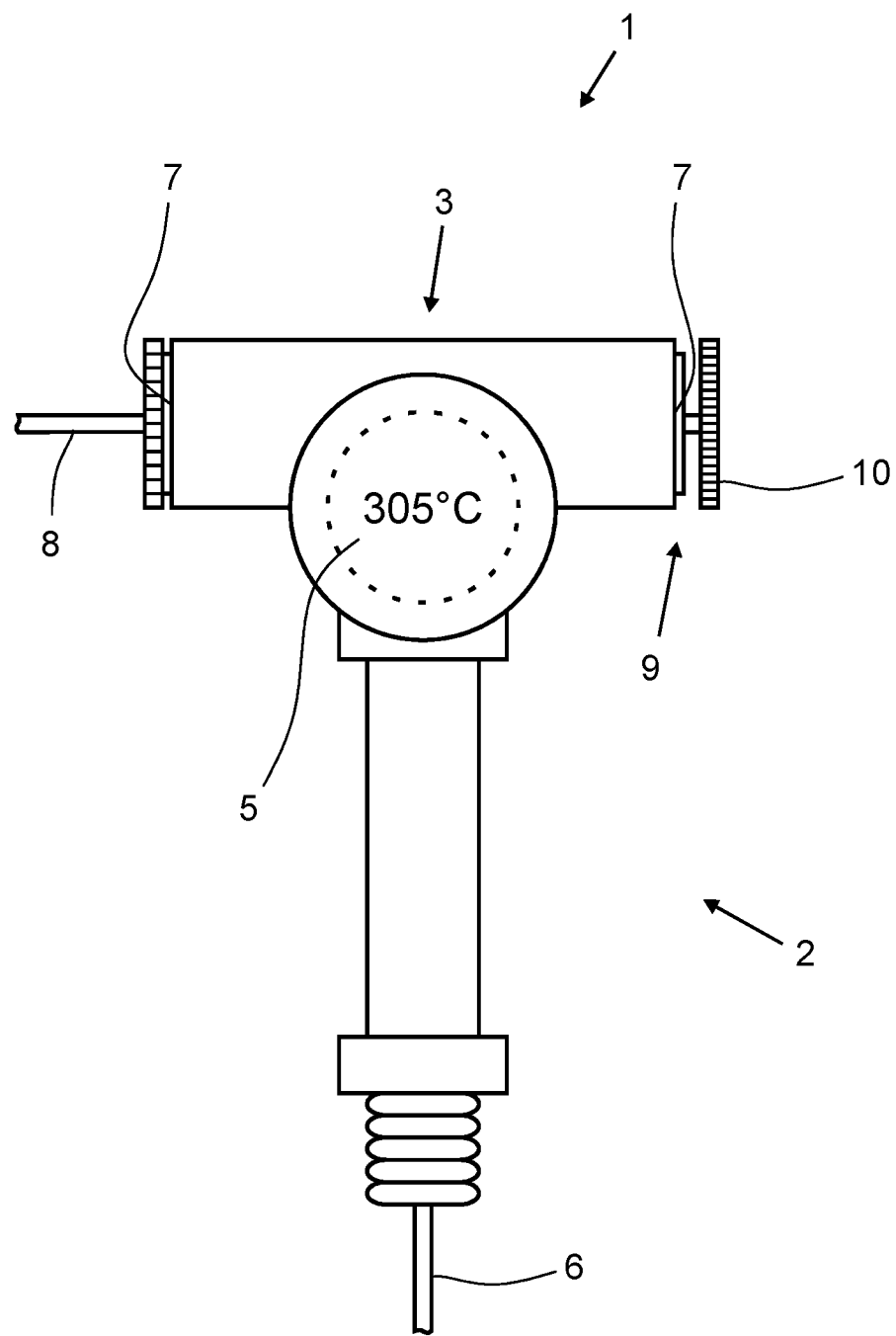
FIG. 1 shows a first embodiment of a transmitter or field device according to the invention.

FIG. 1 shows a first embodiment of a transmitter 1 and a field device 2. The transmitter 1 has a transmitter housing 3, an electronics unit 4 arranged inside the transmitter housing 3 and a display unit 5. The electronics unit 4, not shown here, is connected to a measured value sensor 6, which is designed as a resistance or voltage dependent sensor for temperature measurement in the embodiment shown.

In addition, the transmitter housing 3 has two cable glands 7, each of which is designed as a threaded armor cable gland. Via the first cable gland 7, a power cable 8 is led into the inside of the transmitter housing 3, which is connected to the electronics unit 4. A connection module 9 comprising an operating element 10 is screwed into the second cable gland 7. In the embodiment shown, the operating element 10 is a rotary encoder or encoder.

The operating element 10 is connected to the display unit 5 via a cable connection 11, so that the user of the field device 2 can select and/or control the display of the display unit 5 via the operating element 10.

Figure 2:
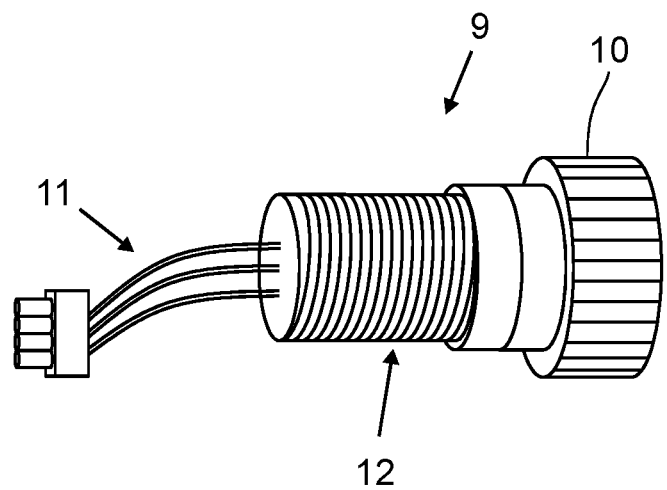
FIG. 2 is a perspective view of an embodiment of a connection module.

FIG. 2 shows an embodiment of a connection module 9, wherein the operating element 10 is a rotary encoder or encoder. The connection module 9 has a threading 12 for connection to the cable gland 7 of the transmitter housing 3, which is molded onto the connection module 9 by means of an injection molding process. For connection to the display unit 5, the connection module 9 has corresponding connection cables 11. The connection module 9 forms a plug with which the cable gland 7 is tightly sealed.

Figure 3:
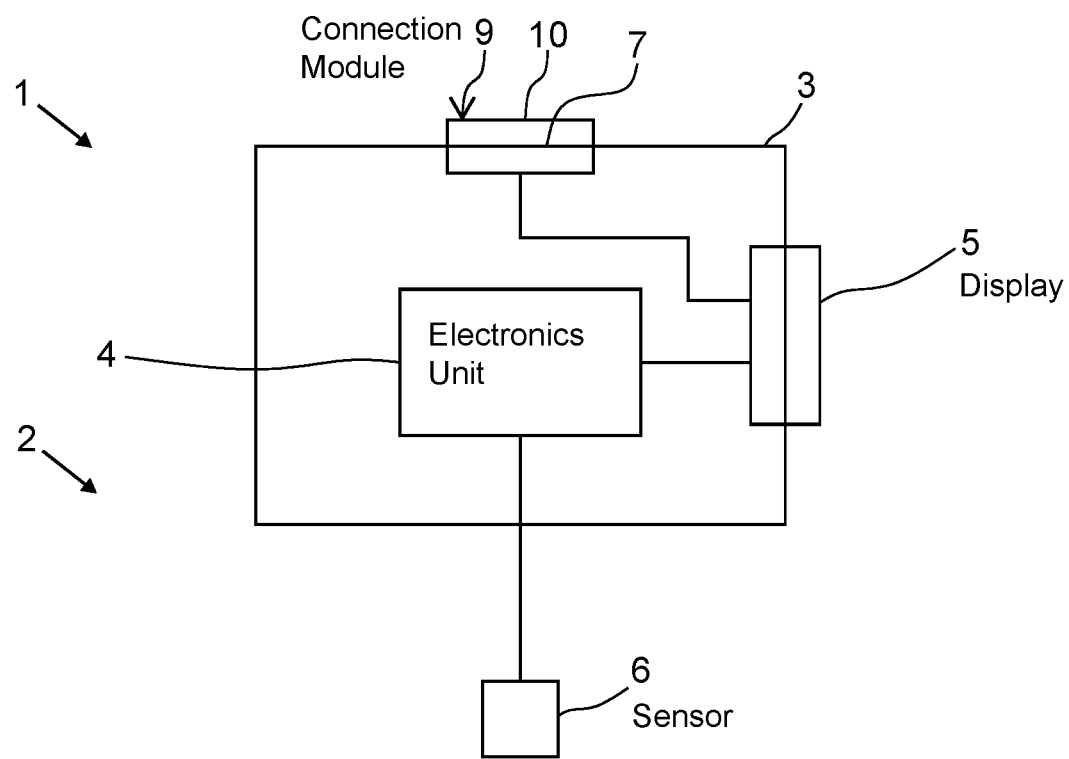
FIG. 3 is diagrammatic representation of a second embodiment of a transmitter according to the invention or a second embodiment of a field device.

FIG. 3 shows a schematic view of another embodiment of a transmitter 1 or a field device 2. The transmitter 1 comprises a transmitter housing 3 in which an electronics unit 4 is arranged, wherein the electronics unit 4 is connected to a measured value sensor 6. In addition, the electronics unit 4 is connected to a display unit 5.

The transmitter housing 3 has a cable gland 7 into which a connection module 9 is screwed. To operate the display unit 5, the connection module 9 has an operating element 10 which is connected to the display unit 5. In the embodiment shown, the operating element 9 can be designed as a rotary encoder or encoder or also as a key or push-button or as a rocker switch or as a toggle switch or as a rotary switch or as a slide controller or as a finger pressure sensor or as an optical sensor or as a microphone or as a control lever.

The operating element 10 can either be operated directly by the user of the field device 2 or it can have an element for wireless communication in the form of a BLUETOOTH® antenna or an antenna for NFC communication.

According to an alternative embodiment, the operating element 10 is alternatively or additionally connected to the electronics unit 4 so that communication with the electronics unit 4 is also ensured.

As a result, the illustrated transmitter or the illustrated field device guarantees a particularly simple and secure operation of the display unit and/or the field device.

What is claimed is:

1. A transmitter comprising:
   a transmitter housing,
   an electronics unit and
   a display unit,
   wherein the electronics unit is adapted for connection to a measured value sensor,
   wherein the electronics unit is connected to the display unit,
   wherein the transmitter housing has at least one cable gland which ensures a sealed cable entry into the transmitter housing,
   wherein at least one connection module is arranged in the at least one cable gland, and
   wherein the at least one connection module comprises at least one operating element for communication with at least one of the display unit and the electronics unit.

2. The transmitter according to claim 1, wherein the cable gland is a threaded armor cable gland.

3. The transmitter according to claim 1, wherein the connection module has a threading and wherein the connection module is screwed into the cable gland in such a way that the connection module acts as a plug to tightly close the cable gland.

4. The transmitter according to claim 1, wherein the at least one operating element comprises at least one of an analog operating element or a digital operating element.

5. The transmitter according to claim 1, wherein the at least one operating element is at least one of a key, a push-button, a rocker switch, a toggle switch, a rotary switch, a slide controller, a finger pressure sensor, an optical sensor, a microphone, or a control lever.

6. The transmitter according to claim 1, wherein the connection module comprises at least one of a wireless interface, an antenna, or an optical interface.

7. The transmitter according to claim 1, wherein the connection module is interchangeably arranged in the cable gland.

8. The transmitter according to claim 1, wherein the display unit is arranged in the connection module.

9. A field device comprising:
   a measured value sensor, and
   a transmitter having a transmitter housing, an electronics unit and a display unit,
   wherein the electronics unit is connected to the measured value sensor, wherein the electronics unit is connected to the display unit, wherein the transmitter housing has at least one cable gland which ensures a sealed cable entry into the transmitter housing, wherein at least one connection module is arranged in the at least one cable gland, and wherein the at least one connection module comprises at least one operating element for communication with at least one of the display unit or the electronics unit.

10. The field device according to claim 9, wherein the connection module has a threading and wherein the connection module is screwed into the cable gland in such a way that the connection module acts as a plug to tightly close the cable gland.

* * * * *